US006957402B2

(12) United States Patent
Templeton et al.

(10) Patent No.: US 6,957,402 B2
(45) Date of Patent: Oct. 18, 2005

(54) YIELD MAXIMIZATION IN THE MANUFACTURE OF INTEGRATED CIRCUITS

(75) Inventors: Mark Templeton, Los Altos, CA (US); Dhrumil Gandhi, Cupertino, CA (US)

(73) Assignee: Artisan Components, Inc., Sunnyvale, CA (US)

( * ) Notice: Subject to any disclaimer, the term of this patent is extended or adjusted under 35 U.S.C. 154(b) by 63 days.

(21) Appl. No.: 10/671,029

(22) Filed: Sep. 24, 2003

(65) Prior Publication Data
US 2005/0066294 A1 Mar. 24, 2005

(51) Int. Cl.[7] ............................................. G06F 17/50
(52) U.S. Cl. ........................ 716/2; 716/1; 716/4; 716/5
(58) Field of Search ................................ 716/1, 2, 4, 5, 716/19

(56) References Cited

U.S. PATENT DOCUMENTS

| 6,418,353 | B1 * | 7/2002 | Rostoker et al. ............ 700/121 |
| 6,539,533 | B1 * | 3/2003 | Brown et al. ................. 716/17 |
| 6,745,371 | B2 * | 6/2004 | Konstadinidis et al. ........ 716/2 |
| 2002/0091979 | A1 * | 7/2002 | Cooke et al. ............... 714/733 |
| 2003/0188268 | A1 * | 10/2003 | Konstadinidis et al. ........ 716/2 |
| 2004/0143797 | A1 * | 7/2004 | Nguyen et al. ................ 716/1 |

* cited by examiner

Primary Examiner—Sun James Lin
(74) Attorney, Agent, or Firm—Martine Penilla & Gencarella, LLP

(57) ABSTRACT

A method and apparatus for improving the manufacturability of Integrated Circuits (ICs) formed on semiconductor dies is described. A plurality of different designs for some or all of the standard cells are made available to the circuit designer. Each different design may address a different problem associated with different manufacturing processes or a different design related yield limiter. Each of the design variants is characterized indicating its relative ease of manufacture, or it's yield sensitivity to certain IC design factors. The designer, typically with assistance from computer aided tools, can then select the standard cell variant for each of the cell used in the IC design that best addresses his or her design constraints. In other embodiments, variant versions of I/O cells and memory cells could also be created and made available to the designer in a similar fashion.

18 Claims, 4 Drawing Sheets

YIELD MAXIMIZATION IN THE MANUFACTURE OF INTEGRATED CIRCUITS

BACKGROUND OF THE INVENTION

1. Field of the Invention

The present invention relates most generally to Integrated Circuits (ICs) formed on semiconductor substrates. More particularly, the present invention relates to methods and apparatus for improving the yield of ICs from the fabrication process.

2. Description of the Related Art

ICs are often implemented by connecting together different types of functional blocks to achieve the desired IC specification. As shown in FIG. 1, some of the functional blocks most often used in IC 10 are logic 12, memory 15, including RAM 13 and register files 14, Input/Output (I/O) 18, analog/mixed signal 22 and custom blocks 28. Some examples of analog/mixed signal functions are Phase Locked Loops (timing generation, de-skewing) 24 and Digital-Analog Converters (not illustrated). Of these, I/O 18, memory 15 and analog blocks 22 are typically used as a single pre-formed unit, or hard macro, by the IC designer, whereas some of the other blocks, primarily the logic, are constructed from a set of lower level sub-blocks, or standard cells, to enable a higher degree of customization and optimization.

An IC designer typically has numerous options to implement each of the functional blocks to create the best possible design for the IC. With respect to the I/O, memory and/or analog functions, hard macros that implement the required function but which are optimized for higher speed or lower power or smaller area are available, and the IC designer chooses the hard macro best suited to the particular design.

Implementing logic functions is much more complex due to the typically large number of standard cells, ranging from tens of thousands to tens of millions, needed to implement the logic functions. Each standard cell is comprised of a predetermined number of transistors coupled together to perform a particular logic function. For example, there are standard cells that perform the functions of NAND, AND, NOR and OR gates, as well as more complicated logic functions such as single bit adders. The IC designer typically has access to different implementations of these low level functions, the different implementations targeted respectively for lower power, higher speed or smaller area. Design automation tools are necessary to analyze various implementations and obtain an optimum result when designing complex logic functions.

FIG. 2 illustrates a typical design flow for logic functions within an IC. In this particular environment, a Behavioral level description or RTL file 51 presents a logic function requirement to a synthesis tool 53. Synthesis tool 53 is coupled to a library of standard cells 55. A typical known standard cell library 55 consists of a plurality of different cell types, including the illustrated AND, NOR, flip-flop and inverter cells. Each cell will be available in several different sizes, the size referring to the size of the output driver transistors. These transistors vary in size depending on what the output of the cell is coupled to. For example, if an AND gate's output is coupled to the input of a single inverter, a small or "1x" output driver transistor will be adequate. If the cell is expected to drive the input of many other cells, larger 2x or 3x output driver transistors may be needed. Although other aspects of the cells must be adjusted depending on the size of the output driver transistors, those adjustments are considered ancillary and cells are typically only offered to designers sorted by the output driver transistor size. Although the selection of the correctly sized cell is driven by the design, it is unavoidable that a larger cell (larger output driver transistors) will have a greater delay than a smaller cell.

Synthesis tool 53 analyzes the logic function and presents the IC designer with an implementation of that function using various types of standard cells that meet the specification. Different cell sizes will be used depending on the number of other cells their output is coupled to. The implementation typically contains a list of cells required and the necessary connections between them. The file that contains the list of connections is typically called a netlist 57.

Netlist 57 and the list of cells are provided as inputs to another automation tool 59 that places the actual cells within the IC layout. Placement tool 59 uses the cell footprint and pin location information from the library 55 to place the cells so as to minimize the interconnects required by netlist 57. The placement of the cells is communicated to another tool, router 63, through a placement file (DEF) 61. Router 63 then draws the wiring between the placed cells to implement the connectivity specified in netlist 57. The wiring generated by the router and the cell level detailed layout are combined to form the IC layout database, which is stored in a GDS2 format as file 65.

One optimization target for IC design is cost. A smaller area logic circuit will allow a larger number of usable ICs per silicon wafer, reducing the cost of each IC. The IC designer's goal is to design the IC so that the specifications are met using the smallest possible silicon area. The IC designer is typically provided with multiple variants of each hard macro, the variants showing different trade offs among the variables of area, speed and power. This extends to standard cells where each logic function, for example an AND gate, has multiple different implementations, the different implementations required for different output drive strength. Standard cells with increased drive strength are typically larger than those with relatively less output drive strength. This is shown pictorially in FIG. 2 by AND cell 55a, b and c, inverter 67a, b and c, flip-flop 69a, b and c and NOR 71a, b and c.

Although the described process and apparatus to create the smallest implementation of an IC incorporating the various building blocks that include logic functions and logic circuits functions reasonably well, it does not consider manufacturability as a key variable.

Until recently, die area was the primary factor affecting IC yield (usable dies per wafer) and hence IC cost. As the size of the various features on an IC have continued to shrink, other factors have become more important. One factor is the increased complexity of each step in process manufacturing. For example, depending on the manufacturing processes used to fabricate the IC, different problems affecting yield can manifest themselves. Certain IC fabrication plants have yield limiting problems with particular process technologies. For example, one process technology may have difficulties with contact formation between metal and polysilicon and another process technology might have difficulties with formation of transistors. Similarly, another technology or plant may have problems with metallization or diffusion formation. In some processes, increases in the leakage currents through transistors beyond the tolerance limits of the design can be a possible yield limiter.

Another factor is the large number of very small geometry features that must be realized on silicon to build an IC, each of which must be manufactured reliably to produce a usable IC. For example, to form any functional IC, many thousands to millions of vias and contacts must be formed between the layers of different materials. It has become increasingly difficult to accurately align and form each of these contacts and vias, which in turn decreases the yield of usable ICs from any given fabrication process. Similar concerns arise for metal wires, transistors and other numerous, critical features. As these problems are statistical in nature, their significance varies depending on the particular IC design. Different problems may be more or less acute for a given IC when different fabrication processes at different plants are used. The current method to use area as the sole indicator of yield is increasingly less determinative. A method and apparatus for implementing IC designs that improves the true yield of the IC considering the process factors described above would be desirable.

SUMMARY OF THE INVENTION

A first embodiment of the present invention operates to improve the yield of ICs that use standard cells to implement their logic functions. Instead of the traditional area minimization approach to improving yield of the logic blocks that allows trade-offs between area and other design specification attributes like power and performance, a set of yield enhancing variants for selected standard cells are also offered to the designer. The different yield enhancing standard cell designs are designed and characterized to compensate for a particular yield limiting factor or factors present in different semiconductor manufacturing environments for different process geometries. The synthesis tool is also modified to make use of the characterized yield data. During the synthesis of the logic functions by the tool, depending upon which parameters are given priority, different variants of the standard cell will be selected from the library, using their yield characterization data as a selection guide, to realize a design optimized to increase the yield of fully functional ICs.

In other embodiments of the present invention, other areas of the IC that typically utilize complex and specialized functions can also be implemented as yield enhancing variants by creating multiple different versions for each hard macro. For example, Input/Output (I/O) cells are typically duplicated around the IC's core and permit signal flow into and out of the core. These cells are usually hand selected by the IC designer. A set of yield enhancing variants for selected I/O cells will be offered to the designer. The designer will then be able to select among a plurality of different yield enhancing I/O cell designs, wherein each of the plurality has been designed and characterized to compensate for a particular yield limiting factor or factors that are present in different semiconductor manufacturing environments and in different process geometries. The availability of different variants of the I/O cells optimized for increased yield in different manufacturing processes will allow design of a functional IC that can be manufactured with high yield.

These embodiments of the present invention as well as other embodiments of the present invention will now be described in detail with reference to the figures listed below.

DETAILED DESCRIPTION OF THE PREFERRED EMBODIMENTS

Figure 1:
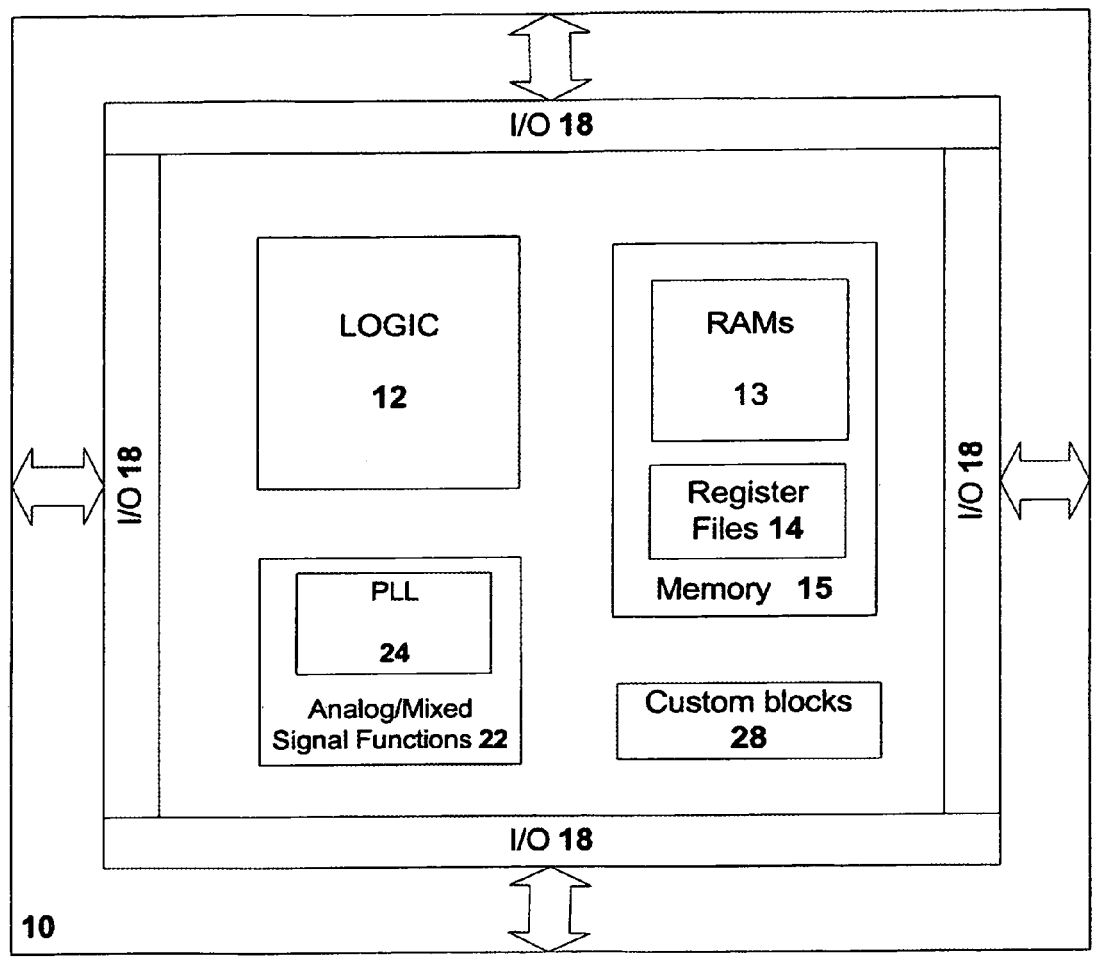
FIG. 1 is a block diagram showing a typical IC design (Prior Art)

In the following description, numerous specific details are set forth in order to provide a thorough understanding of the present invention. It will be apparent, however, to one of skill in the art that the present invention may be practiced without some or all of these specific details. In other instances, well known process steps have not been described in detail in order to unnecessarily obscure the present invention.

The design and manufacture of complex ICs has an established methodology and an established technology. The IC designer implements each of the functional blocks by selecting from various options to achieve the target IC specifications with minimum semiconductor area. In case of the hard macros such as memory, analog and I/Os, as well as special purpose logic blocks, each instance of these blocks is selected manually by the IC designer to achieve the desired results. For logic blocks implemented with a plurality of different standard cells, similar optimization is performed by computer based tools, typically including synthesis software.

The resulting IC design is a database of geometrical shapes on different layers. The layers are typically named diffusion, poly, contact, metal 1-2-3 . . . , via 1-2-3 . . . , etc. for descriptive ease. Within GDS2 database, the layers are assigned numbers and each geometry is associated with a particular layer number. The GDS2 database is then released by the IC designer for mask generation and IC manufacturing. During the mask generation, the database is converted to a set of masks, one for each layer, printed with the corresponding geometries. Each layer, when manufactured, contributes to the creation of circuitry on silicon that should function according to the IC specification. During the manufacturing process, the masks are used to etch or deposit geometries of various layers such as diffusion or metals, as well as connectivity between the layers in form of contacts and vias. The transfer of geometries from the masks to the semiconductor wafer makes use of process called photolithography. Photolithography uses various light or other energy rays in combination with the masks and special chemicals such as resists, to transfer the pattern on the masks to the silicon wafer. The key property of resists is that when exposed to certain type of light or energy rays, they harden into solids. The masks allow selective exposure of the resists. After the pattern is created on the wafer with the resist, the material for the target layer is then etched or deposited. The resultant pattern of the material, metal, poly silicon, etc., is a very close replica of the original pattern of the same layer in the IC database. Some of the complex devices require a combination of layers to form. For example, transistors require diffusion, polysilicon, implants etc. If a connection between two metal wires on separate layers is required, imaging and formation of one or more vias that is correctly aligned to both the metals layers will be needed.

The results of light exposure on resist varies depending upon the proximity of other geometric features, due to potentially interfering optical proximity effects. The electrical properties of multilayer devices can vary significantly depending on the accuracy of inter-layer alignments. Both of these factors contribute to yield losses.

Figure 2:
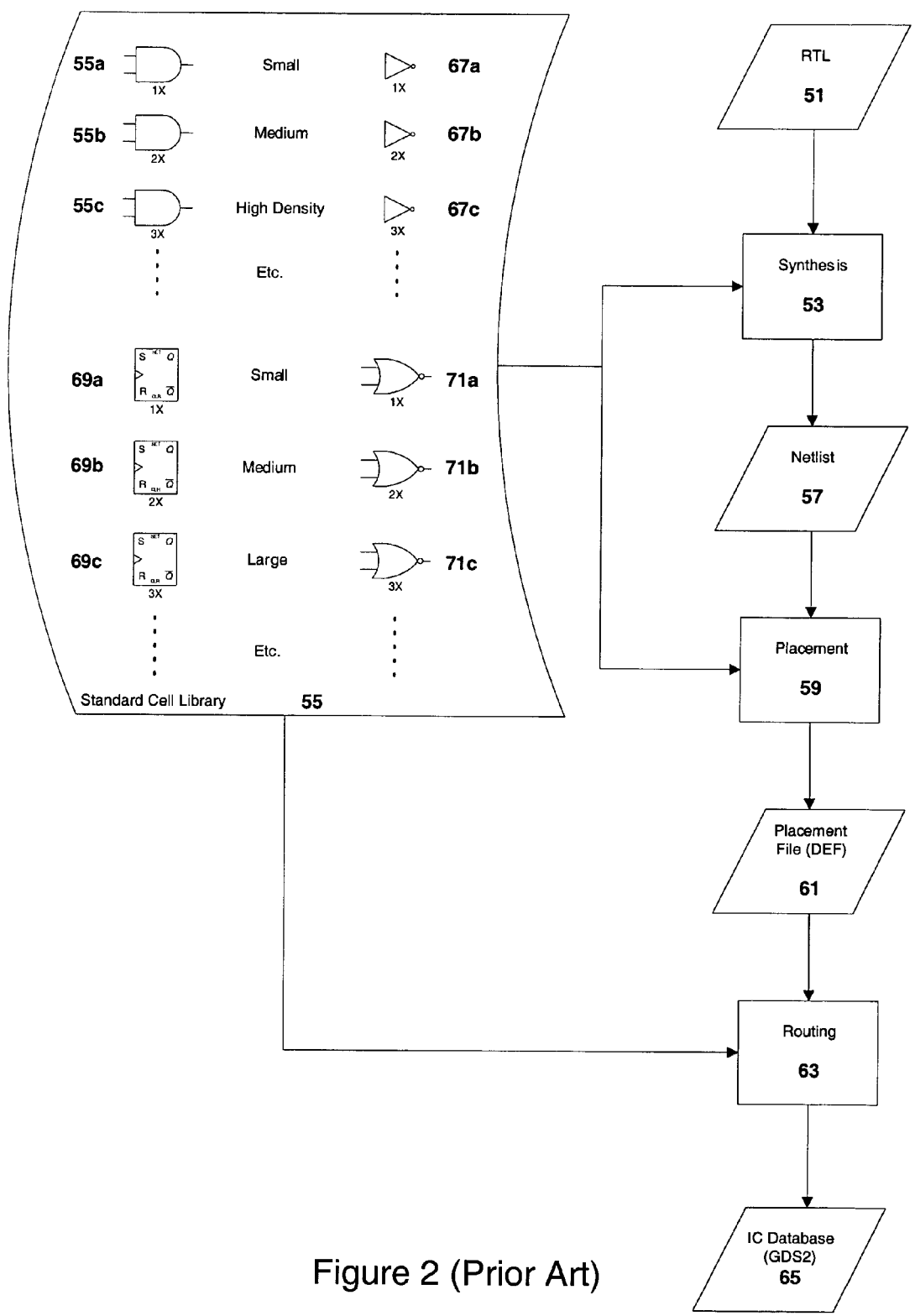
FIG. 2 is a flow diagram showing a known IC design process for logic blocks (Prior Art)
Figure 3:
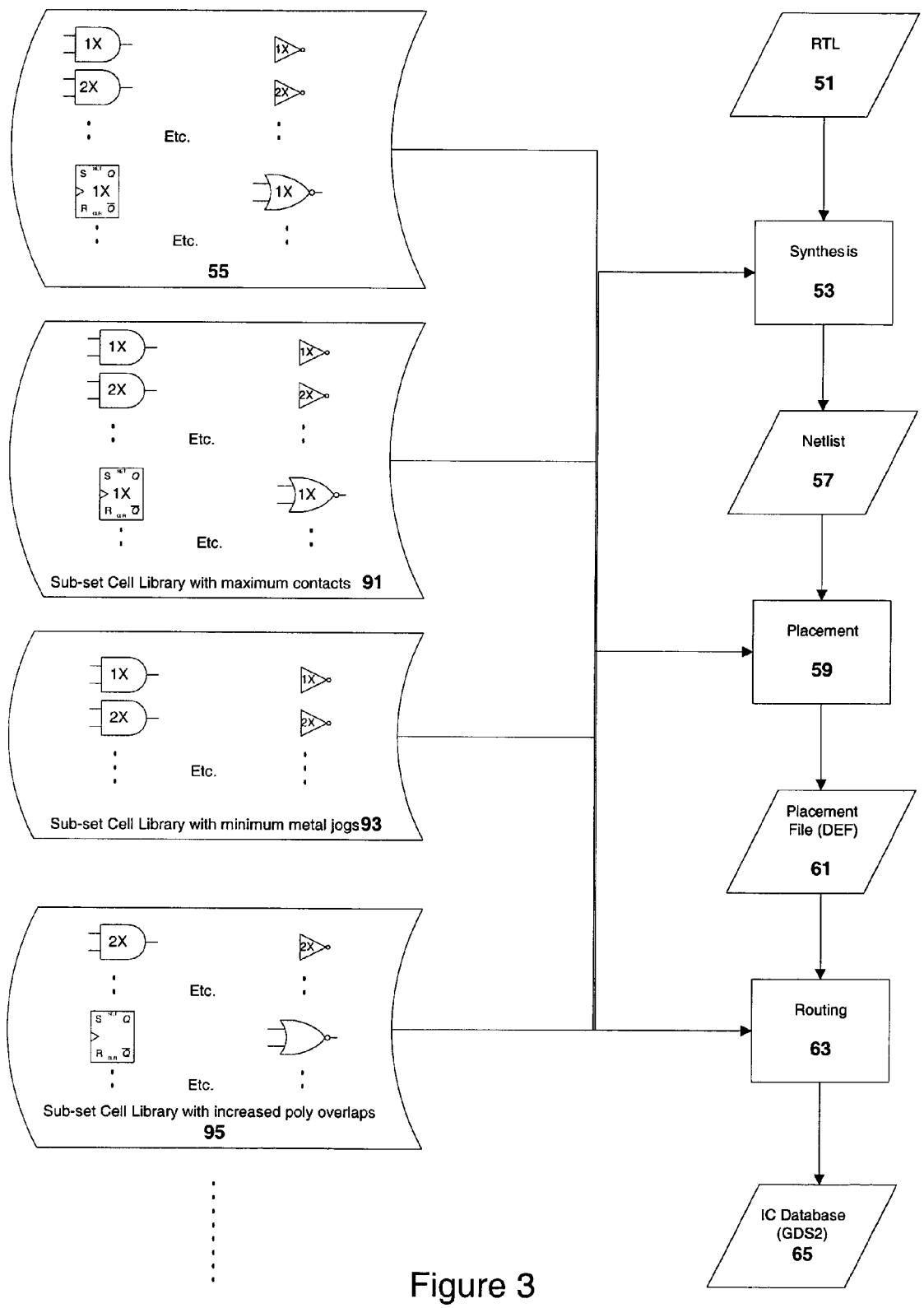
FIG. 3 is a flow diagram showing a logic block design flow using a first embodiment of the present invention.

In the present invention, the design process and apparatus have been modified. Unless otherwise noted, all steps and elements that are common to FIGS. 2 and 3 are unchanged and perform the same task or serve the same function. As shown in FIG. 3, instead of the IC designer having access to multiple variants of standard cells that are optimized for a particular output drive strength, a plurality of different designs of these standard cells and hard macros are made available. Each of the different designs is optimized to maximize the overall yield in a particular manufacturing environment. Although it is possible that all the standard cells in the original standard cell library 55 will be customized in each of these variant libraries, this approach will be quite expensive. As the typical logic circuit design uses only a relatively small subset of all the different standard cells that are available and as the manufacturing yield will be determined predominantly by the manufacturability of those standard cells that are used most often, these variant libraries will typically contain only a subset of the most commonly used standard cells, optimized to address a particular manufacturing problem. In FIG. 3, these optimized sub-sets of the standard cells are labelled as standard cell sub-set library 91, 93 and 95.

For example, certain fabrication processes have particularly poor contact forming capabilities. To address this, a variant of the most commonly used standard cells or hard macros is provided as the variant sub-set cell library 91, with each standard cell in the sub-set having the maximum possible contacts. Although some or all of these variants with extra contacts may have negative impact on other attributes such as area or speed compared to the original standard cell, the overall yield of the IC will be increased by using these cells and hard macros for a manufacturing process where contact formation is poor.

Another process may have particular problems accommodating changes of direction or jogs in the metal lines connecting circuit elements. In response, another set of standard cells and hard macros is designed with minimum metal line jogs (see variant sub-set cell library 93. Other manufacturing processes have difficulty with controlling the spacing between the metal lines, alignment between metals and vias or metals and contacts, alignment between polysilicon and implant to form a particular type of transistor and so forth. Additional sub-sets of standard cells and hard macros can be created to deal with each manufacturing problem individually. Although particular manufacturing problems have been listed and described here, this list and description should not be taken as definitive. Many other manufacturing problems could be addressed by modifying the existing cell libraries.

The same strategy is also applied to design specific yield limiters. Some examples of these are: 1) total number of contacts on the IC, where beyond a certain number of contacts on the IC, statistical probability of a failure in manufacturing would need to be reduced by providing a variant with a redundant contact for each contact in the cell; and 2) optical proximity effects due to the number of features required by a densely packed geometry. Such effects can result in failures due to increased leakage through the transistors or rounding off of metals around contacts or high metal resistance. Versions with increased polysilicon overlap of transistors to prevent leakage problems (see standard cell sub-set 95) or increased metal overlaps to ensure good contacts can be created to address these design specific yield limiters.

It is well understood that the IC design process always involves tradeoffs. Larger circuit elements typically increase operational speed but have lower manufacturing yield. Similarly, faster circuits tend to have increased leakage currents and power consumption.

The multiple versions of the standard cells and hard macros described herein do not escape from the necessity of these engineering tradeoffs. The modifications made to improve the manufacturability of the standard cells may well slow their operating speed or increase their size. Availability of these different versions allow the IC designer to consider the manufacturability and yield as another optimization parameter in addition to traditional parameters like area, power and speed.

To assist the designer in selecting the optimal version of standard cell or hard macro for the IC being designed, a set of parameters that reflect manufacturability based on different yield limiters is defined. Each version of a cell or hard macro is characterized for one or more of these parameters to correlate with the expected yield under a particular manufacturing environment. Having these different yield characterization data available during the design process, the IC designer can choose the version that best meets the specified design criteria of speed and power, while maximizing yield. For the synthesis based logic design flow, the synthesis tool can be modified to evaluate these characterized parameters and optimize the yield using algorithms similar to the present area minimization based approaches.

With hard macros, especially those with repeated structures like memories, another embodiment is possible. As the memory yield and area are dominated by the basic storage element, also called the core cell, much higher levels of optimization options can be implemented for these macros and provided to the IC designer. In these cases, the different versions of the macro are created by using different core cell implementations.

Figure 4:
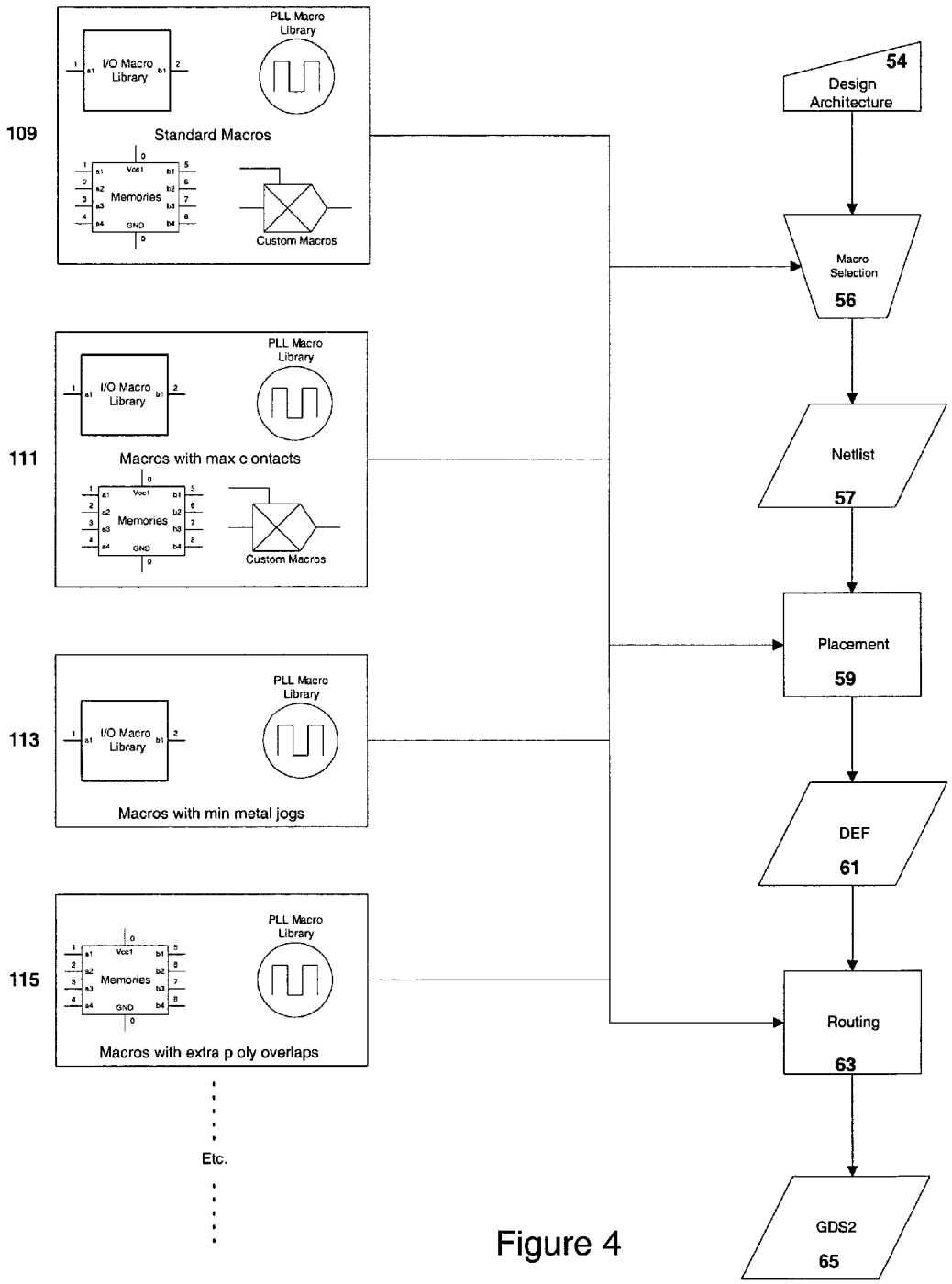
FIG. 4 is a flow diagram illustrating how the first embodiment of the present invention would be utilized within the hard macro block design flow.

As shown in FIG. 4, the design process when using hard macro blocks embodying the present invention is very similar to the process shown in FIG. 3. Again, element and process which have the same number in FIGS. 3 and 4 serve the same function and perform the same operation. Once a design architecture has been created at step 54, hard macro block selection occurs at step 56. At step 56, the designer can select from a library of hard macro blocks. As illustrated, some of the macros are optimized for maximum contacts (sub-set macro library 111), some for minimum metal jogs (sub-set macro library 113), some for additional poly layer overlap (sub-set macro library 115) and so forth. Although not every macro block in each of its possible forms has been shown, to one skilled in the art the necessary extensions and modifications of these blocks will be clear from this specification. These different implementations address different yield limiters as well as the IC design specific issues like total number of contacts in the entire design or the memory repair capabilities incorporated into the design. The IC designer can now choose the highest yield implementation based on the process yield and defect profiles as well as the IC design specific information.

I/O, analog and other hard macros lend themselves to one or both approaches. In some cases, an often repeated element can be optimized through different versions, and for some other blocks, the entire block would be modified to address one or more manufacturing yield limiters.

Although the foregoing invention has been described in some detail for purposes of clarity of understanding, it will be apparent that certain changes and modifications may be practiced with the scope of the appended claims. Accordingly, the present embodiments are to be considered as illustrative and not restrictive, and the invention is not to be limited to the details given herein, but may be modified within the scope and equivalents of the appended claims.

What is claimed is:

1. In a semiconductor manufacturing environment where logic functions are implemented by coupling together of a plurality of different types of standard cells, each type of standard cell implementing a particular logic function, a method for improving yield of integrated circuits through the semiconductor manufacturing environment, the method comprising the steps of:
designing a plurality of different variants for the standard cells in a library, each of the plurality of different standard cell variants addressing a different manufacturing problem;
selecting standard cells in one standard cell variant to be used in a particular manufacturing environment to optimize the yield of integrated circuits fabricated using the selected standard cells; and
coupling together the selected standard cells to implement the logic functions wherein each of the variants is assigned a manufacturability rating, the step of selecting a standard cell variant being influenced by the assigned manufacturability rating.

2. In a semiconductor manufacturing environment where logic functions are implemented by coupling together of a plurality of different types of standard cells, each type of standard cell implementing a particular logic function, a method for improving yield of integrated circuits through the semiconductor manufacturing environment, the method comprising the steps of:
designing a plurality of different variants for the standard cells in a library, each of the plurality of different standard cell variants addressing a different manufacturing problem, wherein the variants are designed to at least address the manufacturing problems of poor contact formation, contact alignment, metal line spacing and metal line direction changes;
selecting standard cells in one standard cell variant to be used in a particular manufacturing environment to optimize the yield of integrated circuits fabricated using the selected standard cells; and
coupling together the selected standard cells to implement the logic functions.

3. In a semiconductor manufacturing environment where logic functions are implemented by coupling together of a plurality of different types of standard cells, each type of standard cell implementing a particular logic function, a method for improving yield of integrated circuits through the semiconductor manufacturing environment, the method comprising the steps of:
designing a plurality of different variants for the standard cells in a library, each of the plurality of different standard cell variants addressing a different manufacturing problem;
selecting standard cells in one standard cell variant to be used in a particular manufacturing environment to optimize the yield of integrated circuits fabricated using the selected standard cells; and
coupling together the selected standard cells to implement the logic functions.

4. In an integrated circuit design environment wherein multiple standard components are used to form an integrated circuit design, a method for allowing an integrated circuit designer to optimize the integrated circuit design, the method comprising the steps of:
designing a plurality of variants of the multiple standard components wherein the variants are designed to at least address the manufacturing problems of poor contact formation, contact alignment, metal line spacing and metal line direction changes;
rating each variant on at least one variable; and
selecting the variant whose rating most closely matches designer's criteria for use in the integrated circuit design.

5. The method of claim 4 wherein the standard components comprise standard logic cells.

6. The method of claim 4 wherein the standard components comprise input/output cells.

7. The method of claim 4 wherein the standard components comprise memory core cells or entire memory blocks including core cells.

8. The method of claim 4 wherein the standard components perform at least an analog function, the analog function including one of at least phase locked loops and analog-to-digital converters.

9. The method of claim 4 wherein each of the standard components and its variants are characterized to indicate the manufacturing yield of the particular variant.

10. The method of claim 4 wherein the variants of standard components comprise variants of standard logic cells.

11. The method of claim 10 wherein the variants of standard logic cells have each been assigned a rating which indicates its manufacturability in at least a manufacturing environment.

12. The method of claim 11 wherein the variants of standard logic cells have a plurality of different manufacturability ratings, a different rating being assigned for each different potential manufacturing environment.

13. A system for improving the manufacturability of an integrated circuit, the system comprising:
a library comprised of a plurality of variant designs for standard components of the integrated circuit, each of the plurality of variant designs compensating for at least a known manufacturing problem; and
a synthesis tool coupled to the library, the synthesis tool formulating and presenting to a user a proposed integrated circuit design, the proposed integrated circuit design incorporating a variant design that corrects for a known manufacturing problem encountered in a particular manufacturing environment selected by the user.

14. The system of claim 13 wherein the library is further comprised of a plurality of variant designs of standard logic cells.

15. The system of claim 13 wherein the library is further comprised of a plurality of variant designs of memory core cells.

16. The system of claim 13 wherein the library is further comprised of a plurality of variant designs of input/output cells.

17. A system for improving the manufacturability of an integrated circuit, the system comprising:
a library comprised of a plurality of variant designs for standard components of the integrated circuit, each of the plurality of variant designs compensating for at least a known manufacturing problem; and
a synthesis tool coupled to the library, the synthesis tool formulating and presenting to a user a proposed integrated circuit design, the proposed integrated circuit design incorporating a variant design that corrects for a known manufacturing problem encountered in a particular manufacturing environment selected by the user wherein the library is further comprised of a plurality of variant designs of standard logic cells and wherein the plurality of variant designs of standard logic cells are rated on a manufacturability index, a different rating being assigned to each variant design for each manufacturing environment in which it is used.

18. A system for improving the manufacturability of an integrated circuit, the system comprising:
   a library comprised of a plurality of variant designs for standard components of the integrated circuit, each of the plurality of variant designs compensating for at least a known manufacturing problem; and
   a synthesis tool coupled to the library, the synthesis tool formulating and presenting to a user a proposed integrated circuit design, the proposed integrated circuit design incorporating a variant design that corrects for a known manufacturing problem encountered in a particular manufacturing environment selected by the user wherein the plurality of variant designs also include compensation for a design related integrated circuit yield limiter, the integrated circuit yield limiters including at least leakage current through transistors.

* * * * *